(12) United States Patent
Alayavalli et al.

(10) Patent No.: US 10,276,353 B2
(45) Date of Patent: Apr. 30, 2019

(54) DUAL-CHANNEL SHOWERHEAD FOR FORMATION OF FILM STACKS

(71) Applicant: Applied Materials, Inc., Santa Clara, CA (US)

(72) Inventors: Kaushik Alayavalli, Santa Clara, CA (US); Xinhai Han, Santa Clara, CA (US); Praket P. Jha, San Jose, CA (US); Masaki Ogata, San Jose, CA (US); Zhijun Jiang, Sunnyvale, CA (US); Allen Ko, Fremont, CA (US); Ndanka O. Mukuti, Santa Clara, CA (US); Thuy Britcher, San Jose, CA (US); Amit Kumar Bansal, Sunnyvale, CA (US); Ganesh Balasubramanian, Sunnyvale, CA (US); Juan Carlos Rocha-Alvarez, San Carlos, CA (US); Bok Hoen Kim, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 323 days.

(21) Appl. No.: 15/142,022

(22) Filed: Apr. 29, 2016

(65) Prior Publication Data

US 2016/0322200 A1    Nov. 3, 2016

Related U.S. Application Data

(60) Provisional application No. 62/155,897, filed on May 1, 2015, provisional application No. 62/275,516, filed on Jan. 6, 2016.

(51) Int. Cl.
*C23C 16/50* (2006.01)
*C23C 16/509* (2006.01)

*C23C 16/503* (2006.01)
*C23C 16/505* (2006.01)
*H01J 37/32* (2006.01)
(Continued)

(52) U.S. Cl.
CPC ...... *H01J 37/3244* (2013.01); *C23C 16/4404* (2013.01); *C23C 16/45565* (2013.01); *C23C 16/45574* (2013.01); *C23C 16/509* (2013.01); *H01J 37/32091* (2013.01)

(58) Field of Classification Search
CPC ..... C23C 16/50; C23C 16/503; C23C 16/505; C23C 16/509; C23C 16/45574; C23C 16/4404; C23C 16/45565; H01J 37/3244; H01J 37/32091
USPC ........ 118/723 E; 156/345.43, 345.44, 345.45
See application file for complete search history.

(56) References Cited

U.S. PATENT DOCUMENTS

2012/0090691 A1* 4/2012 Baluja ................. C23C 16/4405 137/13
2012/0097330 A1* 4/2012 Iyengar ............. C23C 16/45565 156/345.34
(Continued)

*Primary Examiner* — Rudy Zervigon
(74) *Attorney, Agent, or Firm* — Patterson + Sheridan LLP

(57) ABSTRACT

A method and apparatus for a dual-channel showerhead is provided. In one embodiment the showerhead comprises a body comprising a conductive material having a plurality of first openings formed therethrough comprising a first gas channel and a plurality of second openings formed therethrough comprising a second gas channel that is fluidly separated from the first gas channel, wherein each of the first openings having a geometry that is different than each of the second openings.

20 Claims, 5 Drawing Sheets

(51) Int. Cl.
*C23C 16/455* (2006.01)
*C23C 16/44* (2006.01)

(56) References Cited

U.S. PATENT DOCUMENTS

2012/0175062 A1* 7/2012 de la Llera ....... H01J 37/32091
156/345.34
2015/0211123 A1* 7/2015 Glukhoy ............... C23C 16/453
118/712
2015/0376788 A1* 12/2015 Zhou ................. C23C 16/45574
118/723 R

* cited by examiner

DUAL-CHANNEL SHOWERHEAD FOR FORMATION OF FILM STACKS

CROSS-REFERENCE TO RELATED APPLICATIONS

This application claims priority from U.S. Provisional Patent Application Ser. No. 62/155,897, filed May 1, 2015, and U.S. Provisional Patent Application Ser. No. 62/275,516, filed Jan. 6, 2016, both applications are hereby incorporated by reference herein.

BACKGROUND

Field

Embodiments disclosed herein generally relate to a showerhead for forming films on substrates, such as semiconductor substrate and, more specifically, a dual channel showerhead for film stack formation.

Description of the Related Art

Semiconductor processing involves a number of different chemical and physical processes enabling minute integrated circuits to be created on a substrate. Layers of materials which make up the integrated circuit are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

In the manufacture of integrated circuits, plasma processes are often used for deposition of various material layers on substrates. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit fabrication with stringent thermal budgets, such as for very large scale or ultra-large scale integrated circuit (VLSI or ULSI) device fabrication.

Precursor gases for forming film stacks such as oxide-nitride-oxide (ONO) stacks and oxide-polysilicon-oxide (OPO) stacks are delivered to the substrate through a showerhead. A plasma of the gases is formed in or near the showerhead as the gases exit openings of the showerhead and reactive species are deposited on the substrate to form the various films.

However, the precursor gases are typically delivered through the same openings in the showerhead (e.g., a single channel showerhead). This type of showerhead is limited in terms of plasma density, which limits deposition rate and throughput. Further, oxide precursors and nitride precursors have different flow sensitivities as well as different sensitivities to electromagnetic energy that is utilized to form the plasma. Additionally, the conventional showerheads may leave a visual imprint on a substrate that matches the pattern of openings in the showerhead, which is undesirable.

Therefore, what is needed is a showerhead that includes discrete channels for uniform delivery of oxide and nitride precursors.

SUMMARY

A method and apparatus for a dual-channel showerhead are provided. In one embodiment the showerhead comprises a body comprising a conductive material having a plurality of first openings formed therethrough comprising a first gas channel and a plurality of second openings formed therethrough comprising a second gas channel that is fluidly separated from the first gas channel, wherein each of the first openings having a geometry that is different than each of the second openings.

In another embodiment, the showerhead comprises a body comprising a conductive material having a plurality of first openings formed therethrough comprising a first gas channel and a plurality of second openings formed therethrough comprising a second gas channel that is fluidly separated from the first gas channel, wherein each of the first openings having a geometry that is different than each of the second openings, and wherein each of the plurality of first openings and the plurality of second openings include a flared portion.

In another embodiment, the showerhead comprises a body comprising a conductive material having a plurality of first openings formed therethrough comprising a first gas channel and a plurality of second openings formed therethrough comprising a second gas channel that is fluidly separated from the first gas channel, wherein each of the first openings having a geometry that is different than each of the second openings, and wherein each of the plurality of first openings and the plurality of second openings include a flared portion and the flared portions of the first openings have a geometry that is different than a geometry of the flared portions of the second openings.

BRIEF DESCRIPTION OF THE DRAWINGS

So that the manner in which the above-recited features of the present disclosure can be understood in detail, a more particular description, briefly summarized above, may be had by reference to embodiments, some of which are illustrated in the appended drawings. It is to be noted, however, that the appended drawings illustrate only typical embodiments and are therefore not to be considered limiting of its scope, for the embodiments disclosed herein may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure are illustratively described below in reference to plasma chambers, although embodiments described herein may be utilized in other chamber types and in multiple processes. In one embodiment, the plasma chamber is utilized in a plasma enhanced chemical vapor deposition (PECVD) system. Examples of PECVD systems that may be adapted to benefit from the disclosure include a PRODUCER® SE CVD system, a PRODUCER® GT™ CVD system or a DXZ® CVD system, all of which are commercially available from Applied Materials, Inc., Santa Clara, Calif.

The PRODUCER® SE CVD system chamber (e.g., 200 mm or 300 mm) has two isolated processing regions that may be used to deposit thin films on substrates, such as conductive films, oxide films such as silicon oxide films, nitride films, polysilicon films, carbon-doped silicon oxides and other materials. Although the exemplary embodiment includes two processing regions, it is contemplated that embodiments disclosed herein may be used to advantage in systems having a single processing region or more than two processing regions. It is also contemplated that embodiments disclosed herein may be utilized to advantage in other plasma chambers, including etch chambers, ion implantation chambers, plasma treatment chambers, and in resist stripping chambers, among others. It is further contemplated that embodiments disclosed herein may be utilized to advantage in plasma processing chambers available from other manufacturers.

Figure 1:
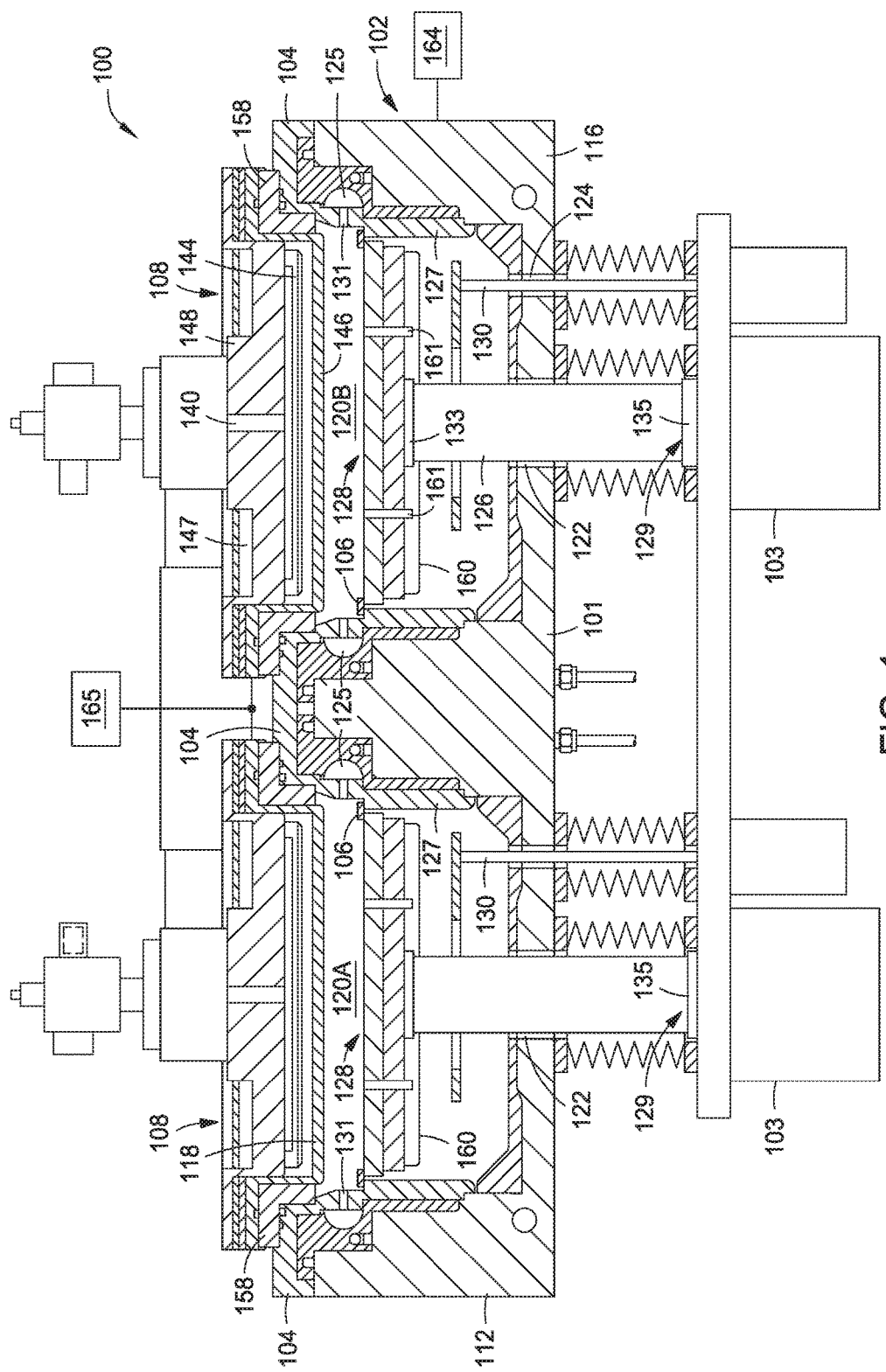
FIG. 1 is a partial cross sectional view of a plasma system.

FIG. 1 is a partial cross sectional view of a plasma system 100. The plasma system 100 generally comprises a chamber body 102 having sidewalls 112, a bottom wall 116, and an interior sidewall 101 defining a pair of processing regions 120A and 120B. Each of the processing regions 120A-120B are similarly configured, and for the sake of brevity, only components in the processing region 120B are described.

A pedestal 128 may be disposed in the processing region 120B through a passage 122 formed in the bottom wall 116 in the system 100. The pedestal 128 provides a heater adapted to support a substrate (not shown) on the upper surface thereof. The pedestal 128 may include heating elements, for example resistive heating elements, to heat and control the substrate temperature at a desired process temperature. Alternatively, the pedestal 128 may be heated by a remote heating element, such as a lamp assembly.

The pedestal 128 may be coupled by a flange 133 to a stem 126. The stem 126 may couple the pedestal 128 to a power outlet or power box 103. The power box 103 may include a drive system that controls the elevation and movement of the pedestal 128 within the processing region 120B. The stem 126 may also contain electrical power interfaces to provide electrical power to the pedestal 128. The power box 103 may also include interfaces for electrical power and temperature indicators, such as a thermocouple interface. The stem 126 also includes a base assembly 129 adapted to detachably couple to the power box 103 thereto. A circumferential ring 135 is shown above the power box 103. In one embodiment, the circumferential ring 135 is a shoulder adapted as a mechanical stop or land configured to provide a mechanical interface between the base assembly 129 and the upper surface of the power box 103.

A rod 130 may be disposed through a passage 124 formed in the bottom wall 116 of the processing region 120B and may be utilized to position substrate lift pins 161 disposed through the pedestal 128. The substrate lift pins 161 selectively space the substrate from the pedestal to facilitate exchange of the substrate with a robot (not shown) utilized for transferring the substrate into and out of the processing region 120B through a substrate transfer port 160.

A chamber lid 104 may be coupled to a top portion of the chamber body 102. The lid 104 may accommodate one or more gas distribution systems 108 coupled thereto. The gas distribution system 108 includes a gas inlet passage 140 which delivers reactant and cleaning gases through a dual-channel showerhead 118 into the processing region 120B. The dual-channel showerhead 118 includes an annular base plate 148 having a blocker plate 144 disposed intermediate to a faceplate 146. A radio frequency (RF) source 165 may be coupled to the dual-channel showerhead 118. The RF source 165 powers the dual-channel showerhead 118 to facilitate generating a plasma region between the faceplate 146 of the dual-channel showerhead 118 and the pedestal 128. In one embodiment, the RF source 165 may be a high frequency radio frequency (HFRF) power source, such as a 13.56 MHz RF generator. In another embodiment, RF source 165 may include a HFRF power source and a low frequency radio frequency (LFRF) power source, such as a 300 kHz RF generator. Alternatively, the RF source may be coupled to other portions of the chamber body 102, such as the pedestal 128, to facilitate plasma generation. A dielectric isolator 158 may be disposed between the lid 104 and the dual-channel showerhead 118 to prevent conducting RF power to the lid 104. A shadow ring 106 may be disposed on the periphery of the pedestal 128 that engages the substrate at a desired elevation of the pedestal 128.

Optionally, a cooling channel 147 may be formed in the annular base plate 148 of the gas distribution system 108 to cool the annular base plate 148 during operation. A heat transfer fluid, such as water, ethylene glycol, a gas, or the like, may be circulated through the cooling channel 147 such that the base plate 148 may be maintained at a predefined temperature.

A liner assembly 127 may be disposed within the processing region 120B in very close proximity to the sidewalls 101, 112 of the chamber body 102 to prevent exposure of the sidewalls 101, 112 to the processing environment within the processing region 120B. The liner assembly 127 includes a circumferential pumping cavity 125 that may be coupled to a pumping system 164 configured to exhaust gases and byproducts from the processing region 120B and control the pressure within the processing region 120B. A plurality of exhaust ports 131 may be formed on the liner assembly 127. The exhaust ports 131 are configured to allow the flow of gases from the processing region 120B to the circumferential pumping cavity 125 in a manner that promotes processing within the system 100.

Figure 2A:
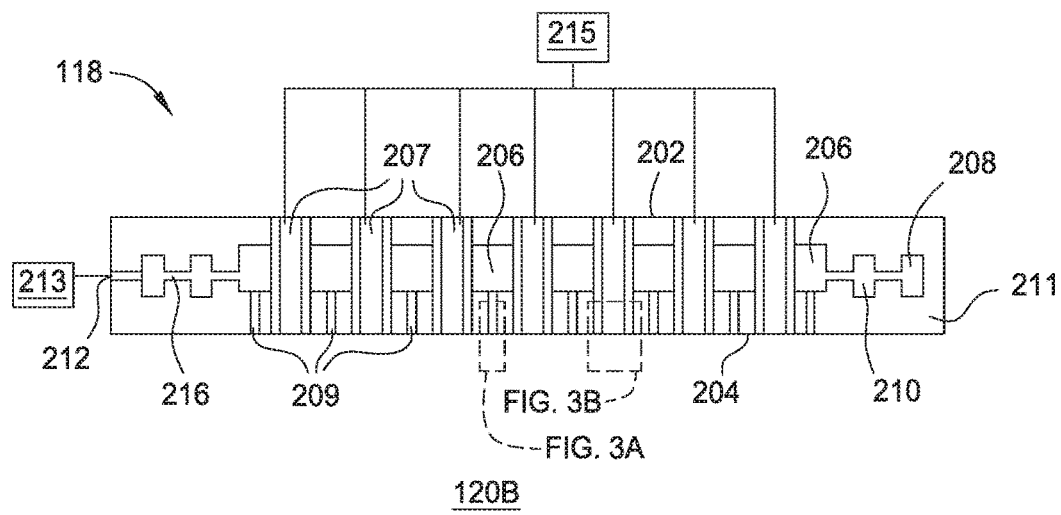
FIG. 2A is a cross sectional view of the dual-channel showerhead of FIG. 1 according to embodiments described herein.

FIG. 2A is a cross sectional view of the dual-channel showerhead 118 according to embodiments described herein. The dual-channel showerhead 118 may be used in the processing region 120B. The dual-channel showerhead 118 may have a first surface 202 that is facing the gas distribution system 108 (shown in FIG. 1) and a second surface 204 opposite to the first surface 202. The second surface 204 may be facing the pedestal 128 (shown in FIG. 1). The first surface 202 may be spaced from the second surface 204 to provide an internal volume 206. The first and second surfaces 202, 204, respectively, may be composed of or coated with a material that may be substantially unreactive to ions or radicals present in plasma of precursor gases delivered through openings formed between the first surface 202 and the second surface 204 of the dual-channel showerhead 118. A plurality of first openings 207 and a plurality of second openings 209 may be provided to deliver discrete precursor gases to a substrate. For example, each of the plurality of first openings 207 may be utilized to deliver an oxide precursor gas and each of the plurality of second openings 209 may be utilized to deliver a nitride (or polysilicon) containing gas, or vice versa. Each of the plurality of first openings 207 and the plurality of second openings 209 may be fluidly separated to prevent mixing of the precursor gases. Each of the plurality of first openings 207 may be geometrically different from each of the plurality of second openings 209. The different geometry provides for different flow characteristics for different precursor gases. The different geometry may also provide a different electric field for forming plasma.

The dual-channel showerhead 118 may include a body 211 that may be formed from or comprises an electrically conductive material such that the dual-channel showerhead 118 may function as an electrode. Exemplary conductive materials include aluminum, stainless steel, titanium, or other conductive material that includes the ability to resist process chemistry. Each of the plurality of first openings 207 and the plurality of second openings 209 may be tubes or orifices machined in the body 211. At least a portion of the surfaces 202, 204, as well as interior surfaces of the first openings 207 and the second openings 209, may be bead blasted. In some embodiments, at least a portion of the surfaces 202, 204, as well as interior surfaces of the first openings 207 and the second openings 209, may be coated with AlN, $SiO_2$, $Y_2O_3$, MgO, anodized $Al_2O_3$, sapphire, ceramics containing one or more of $Al_2O_3$, sapphire, AlN, $Y_2O_3$, MgO, or $Si_vY_wMg_xAl_yO_z$, or other plasma resistant and/or process chemistry resistant coating. In the molecular structure of $Si_vY_wMg_xAl_yO_z$, v ranges from about 0.0196 to about 0.2951; w ranges from about 0.0131 to about 0.1569; x ranges from about 0.0164 to about 0.0784; y ranges from about 0.0197 to about 0.1569; and z ranges from about 0.5882 to about 0.6557, wherein v+w+x+y+z=1 (excluding impurities). If a coating is used, the thickness of the coating may be between about 1 μm and about 1 mm.

Each of the plurality of first openings 207 may extend from the first surface 202 to the second surface 204. The plurality of first openings 207 are in fluid communication with a gas source 215. The gas source 215 may include nitride precursors such as $NH_3$, SiN, and the like.

The internal volume 206 may be in fluid communication with one or more annular channels 208, 210. Each of the plurality of second openings 209 may extend from the internal volume 206 to the second surface 204. The one or more annular channels 208, 210 may be connected to an inlet 212, which may be coupled to a gas source 213. The gas source 213 may provide a precursor gas, such as a silicon containing gas, to the dual-channel showerhead 118, and the precursor gas flows through the one or more annular channels 208, 210 to the internal volume 206, and to the processing region 120B via the plurality of second openings 209. Examples of the silicon containing precursor gas include an organosilicon, a tetraalkyl orthosilicate gases, and a disiloxane. Organosilicon gases include gases of organic compounds having at least one carbon-silicon bond. Tetraalkyl orthosilicate gases include gases consisting of four alkyl groups attached to an $SiO_4^{4-}$ ion. More particularly, the one or more precursor gases may be (dimethylsilyl) (trimethylsilyl)methane (($Me)_3SiCH_2SiH(Me)_2$), hexamethyldisilane (($Me)_3SiSi(Me)_3$), trimethylsilane (($Me)_3SiH$), tetramethylsilane (($Me)_4Si$), tetraethoxy-silane (($EtO)_4Si$), tetramethoxysilane (($MeO)_4Si$), tetrakis-(trimethylsilyl)silane (($Me_3Si)_4Si$), (dimethylamino)dimethylsilane (($Me_2N$) $SiHMe_2$) dimethyldiethoxysilane (($EtO)_2Si(Me)_2$), dimethyldimethoxysilane (($MeO)_2Si(Me)_2$), methyltrimethoxysilane (($MeO)_3Si(Me)$), tris(dimethylamino)silane (($Me_2N)_3SiH$), dimethoxytetramethyldi-siloxane ((($Me)_2Si(OMe))_2O$), disiloxane (($SiH_3)_2O$), bis(dimethylamino)methylsilane (($Me_2N)_2CH_3SiH$), and combinations thereof.

The one or more annular channels 208, 210 may be fluidly connected by one or more connecting channels 216 that have a smaller cross section than the annular channels 208, 210. This configuration may serve to distribute the precursor gas evenly into the internal volume 206 and out of the second openings 209.

Figure 2B:
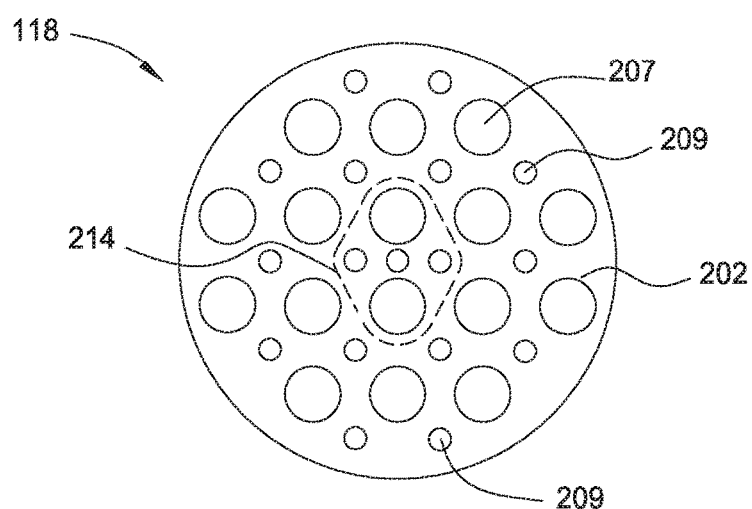
FIG. 2B is a bottom view of the dual-channel showerhead of FIG. 2A according to embodiments described herein.

FIG. 2B is a bottom view of the dual-channel showerhead 118 according to embodiments described herein. The dual-channel showerhead 118 includes the second surface 204 having the plurality of first openings 207 and the plurality of second openings 209. The one or more annular channels 208, 210 and the internal volume 206 may all be embedded in the dual-channel showerhead 118, thus are not shown in the bottom view of the dual-channel showerhead 118. While not shown to-scale for clarity, the number of first openings 207 and second openings 209 may exceed 5,000 for a 300 millimeter substrate.

Figure 3B:
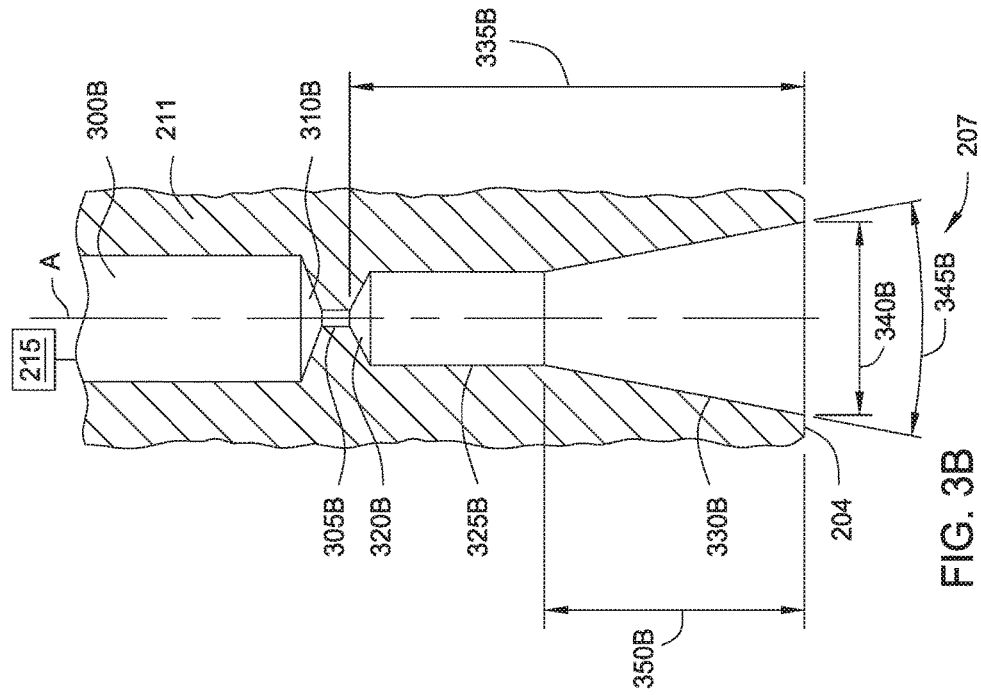
FIG. 3B is an enlarged sectional view of one of the plurality of first openings according to embodiments described herein.
Figure 3A:
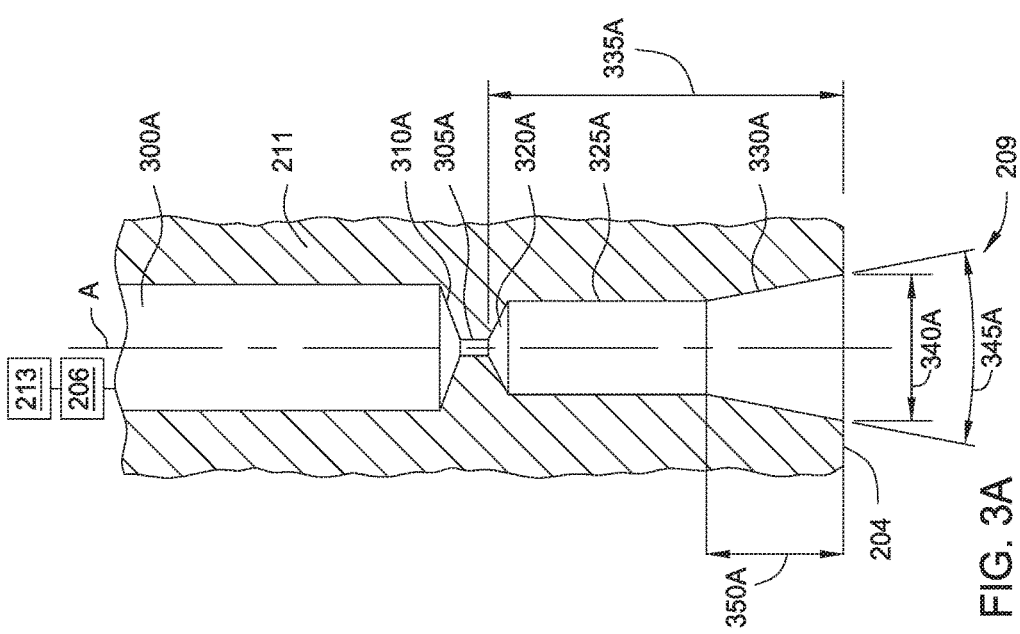
FIG. 3A is an enlarged sectional view of one of the plurality of second openings according to embodiments described herein.

FIG. 3A is an enlarged sectional view of one of the plurality of second openings 209 according to embodiments described herein. FIG. 3B is an enlarged sectional view of one of the plurality of first openings 207 according to embodiments described herein. While not shown, all of the plurality of second openings 209 of FIGS. 2A and 2B may be configured as the second opening 209 shown in FIG. 3A. Likewise, all of the plurality of first openings 207 of FIGS. 2A and 2B may be configured as the first opening 207 shown in FIG. 3B. The second opening 209 and the first opening 207 may be formed concentrically about a longitudinal axis A.

As shown in FIGS. 3A and 3B, the first opening 207 and the second opening 209 includes a first bore 300B, 300A, respectively. Each first opening 207 and each second opening 209 includes a restricting orifice 305B, 305A, respectively. Each restricting orifice 305B, 305A may be coupled to the respective first bore 300B, 300A by a first funnel shaped interface 310B, 310A, respectively. A second funnel shaped interface 320B, 320A couples the respective restricting orifice 305B, 305A to a second bore 325B, 325A, respectively. A flared opening 330B, 330A may be coupled to the respective second bore 325B, 325A. However, at least a lower portion (i.e., a portion below the first bore) of the first opening 207 and the second opening 209 have a different geometry that enables a different flow characteristic and/or a different electric field.

In some embodiments, a length 335A of the second opening 209 may be different than a length 335B of the first opening 207. The lengths 335A, 335B may be provided by adjusting the length of one or both the second bore (325A, 325B) and the flared opening (330A, 330B). In one embodiment, the lengths 335A and/or 335B may be about 75% to about 50% of a thickness of the dual-channel showerhead 118 (shown in FIGS. 2A and 2B). Alternatively or additionally, a major dimension 340A, 340B (e.g., a diameter) of the second opening 209 and the first opening 207, respectively, may be different. Not intending to be bound by theory, it may be desirable to size the major dimension 340A, 340B of the openings 209 and 207 such that a pressure (Torr) times diameter (cm) factor may be maintained in a range between 1 Torr-cm and 10 Torr-cm for all of the openings 209 and 207 in the dual-channel showerhead 118. The pressure may be measured inside the chamber body (e.g., in the processing regions 120A-120B of FIG. 1) near the second surface 204 of the dual-channel showerhead 118 adjacent to the openings 209 and 207 when the gases are delivered through the dual-channel showerhead 118. Further, as an alternative or addition, a flare angle 345A, 345B of the second opening 209 and the first opening 207, respectively, may be different. In one embodiment, the flare angle 345A and 345B may be about 5 degrees to about 20 degrees from the longitudinal axis A. As another alternative or addition, a length 350A, 350B of the second opening 209 and the first opening 207, respectively, may be different. In one embodiment, the length 350A and/or 350B may be about 50% to about 25% of a thickness of the dual-channel showerhead 118 (shown in FIGS. 2A and 2B). One or all of the differences in the lower portion of the second opening 209 and the first opening 207 may be provided based on a desired flow characteristic and/or a desired electric field formation for forming plasma.

Figure 4:
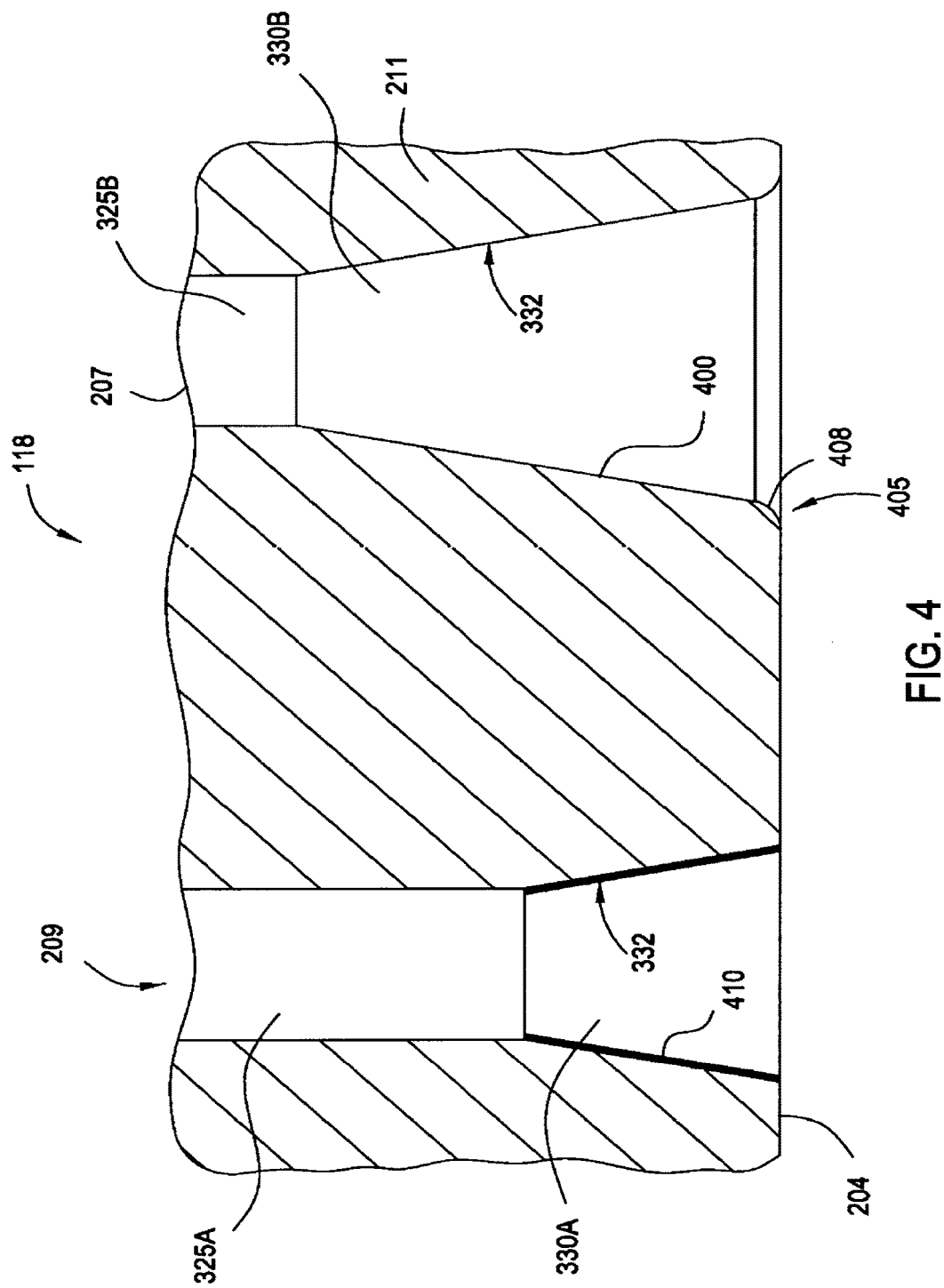
FIG. 4 is a partial side cross-sectional view of alternative or additional embodiments of the first opening and the second opening.

FIG. 4 is a partial side cross-sectional view of alternative or additional embodiments of the first opening 207 and the second opening 209. While not shown, all of the plurality of second openings 209 of FIGS. 2A and 2B may be configured as the second opening 209 shown in FIG. 4. Likewise, all of the plurality of first openings 207 of FIGS. 2A and 2B may be configured as the first opening 207 shown in FIG. 4. The embodiments of the first opening 207 may be combined or replaced with embodiments of the second opening 209, or vice versa, and may be combined with the embodiments shown in FIGS. 3A and 3B.

The first opening 207 may include a roughened surface 400. The roughened surface 400 may be utilized to increase adhesion which reduces defects on a substrate. The roughened surface 400 may be formed by bead blasting in one embodiment. The roughened surface 400 may include an average surface roughness (Ra) of about 30 micro-inches to about 50 micro-inches when the dual-channel showerhead 118 is not to be coated. The flared opening 330B includes a flared portion 332. Alternatively or additionally, the flared opening 330B of the first opening 207 may also include a modified corner region 405. The modified corner region 405 may be a tapered corner or a rounded corner 408. The modified corner region 405 may increase electric field provided by the dual-channel showerhead 118. The second opening 209 may include a coating 410. The coating 410 may include anodized aluminum, AlN, $SiO_2$, $Y_2O_3$, MgO, sapphire, ceramics containing one or more of $Al_2O_3$, sapphire, AlN, $Y_2O_3$, MgO, or $Si_vY_wMg_xAl_yO_z$, as described above. The coating 410 may improve adhesion and may also significantly reduce aluminum fluoride formation. When the coating 410 is used, the roughened surface 400 may include an Ra of about 200 micro-inches to about 300 micro-inches.

Figure 7:
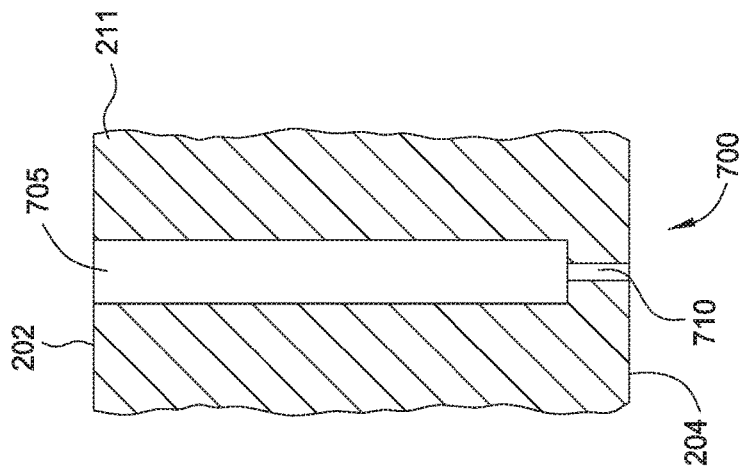
FIG. 7 is a partial side cross-sectional view of an alternative or additional embodiment of an opening that may be utilized with one or both of the plurality of first openings and the plurality of second openings.
Figure 6:
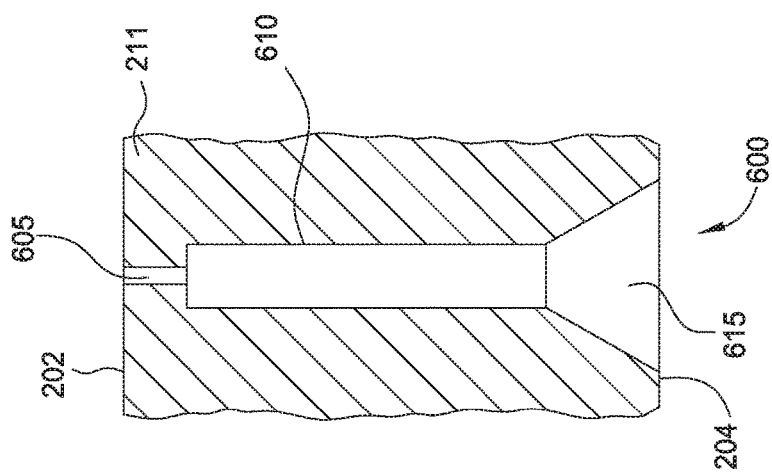
FIG. 6 is a partial side cross-sectional view of an alternative or additional embodiment of an opening that may be utilized with one or both of the plurality of first openings and the plurality of second openings.
Figure 5:
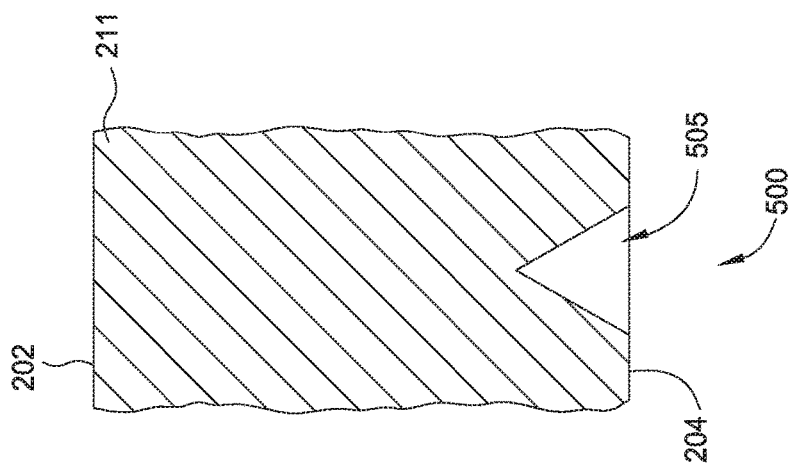
FIG. 5 is a partial side cross-sectional view of an alternative or additional embodiment of an opening that may be utilized with one or both of the plurality of first openings and the plurality of second openings.

FIGS. 5-7 are partial side cross-sectional views of alternative or additional embodiments of openings 500, 600 and 700, respectively, formed within the body 211 of the dual-channel showerhead 118 (shown in FIGS. 1, 2A and 2B). The openings 500, 600 and 700 may be one or more of the plurality of first openings 207 (shown in FIGS. 2A-4) or one or more of the plurality of second openings 209 (shown in FIGS. 2A-4). The embodiments of the openings 500, 600 and 700 may be combined with the plurality of first openings 207 or with the plurality of second openings 209. The openings 500, 600 and 700 may be utilized to modulate plasma generation which may affect uniformity of the deposited film. For example, the openings 500, 600 and 700 may be used to minimize plasma formation at locations where the openings 500, 600 and 700 are positioned. In some embodiments, the openings 500, 600 and/or 700 may be positioned in a center area 214 of the dual-channel showerhead 118 as shown in the view of FIG. 2B. For example, the opening 500, 600 and/or 700 may be utilized as a center opening on the dual-channel showerhead 118. In another example, one or a combination of the openings 500, 600 and 700 may be utilized as openings in rows of openings in the center area 214. Thus, according to this embodiment, plasma formation may be minimized in the center area 214 of the dual-channel showerhead 118. In other embodiments, the openings 500, 600 and/or 700 may be interspersed with the one or both of the plurality of first openings 207 and/or the plurality of second openings 209. In further embodiments, the openings 500, 600 and 700 may replace one or more of the plurality of first openings 207 or the plurality of second openings 209 at positions where reduced plasma formation is desired.

In FIG. 5, the opening 500 comprises a blind cone 505. The blind cone 505 may provide no active flow of precursors therethrough. However, the blind cone 505 may facilitate plasma formation by the hollow cathode effect. The blind cone 505 may extend into the second surface 204 according to the lengths 350A, 350B shown in FIGS. 3A and 3B. The blind cone 505 may include a flare angle similar to one of the flare angles 345A, 345B shown in FIGS. 3A and 3B. The blind cone 505 may include a major dimension similar to one of the major dimensions 340A, 340B shown in FIGS. 3A and 3B.

In FIG. 6, the opening 600 includes a first bore 605 formed in the first surface 202. The first bore 605 is in fluid communication with a second bore 610. The second bore 610 may be concentric with the first bore 605. The second bore 610 includes a diameter greater than a diameter of the first bore 605. The opening 600 also includes a flared opening 615 that is in fluid communication with the second bore 610. The opening 600 may be utilized to minimize flow of precursor gases therethrough, which may minimize plasma formation at positions adjacent the opening 600. The first bore 605 may be sized similar to the restricting orifice 305A, 305B shown in FIGS. 3A and 3B, respectively. The second bore 610 may be sized similar to the first bore 300A, 300B or the second bore 325A, 325B (both shown in FIGS. 3A and 3B, respectively). The flared opening 615 may be sized similar to the flared openings 330A, 330B shown in FIGS. 3A and 3B, respectively.

The opening 700 of FIG. 7 includes a first bore 705 formed in the first surface 202. The first bore 705 is in fluid communication with a second bore 710. The second bore 710 may be concentric with the first bore 705. The second bore 710 includes a diameter less than a diameter of the first bore 705. The opening 700 may be utilized to minimize flow of precursor gases therethrough, which may minimize plasma formation at positions adjacent the opening 700. The first bore 705 may be sized similar to the first bore 300A, 300B or the second bore 325A, 325B (both shown in FIGS. 3A and 3B, respectively). The second bore 710 may be sized similar to the restricting orifice 305A, 305B shown in FIGS. 3A and 3B, respectively.

Embodiments of the dual-channel showerhead 118 as described herein provide different flow paths for oxides and nitrides (or polysilicon) precursors. Each of the oxide and nitride (or polysilicon) precursors may be separately delivered to a substrate through the dual-channel showerhead 118. The shape and size of first openings 207 and second openings 209, as well as the openings 500, 600 and 700 of the dual-channel showerhead 118 may be provided to tune flow characteristics of precursor gases as described herein. For example, flow characteristics of the oxides and nitrides (or polysilicon) precursors may be tuned. The shape and size of first openings 207 and second openings 209, as well as the openings 500, 600 and 700 of the dual-channel showerhead 118 may be utilized to tune the electric field formation for the oxides and nitrides (or polysilicon) precursors. For example, different flare angles 345A, 345B and/or lengths 350A, 350B of each of the plurality of second openings 209 and each of the plurality of first openings 207, respectively, may be different in order to modulate plasma density. Additionally, the shape and size of the openings 500, 600 and 700 may be utilized to tune plasma generation. Shallower lengths 350A, 350B of one of the plurality of second openings 209 or the plurality of first openings 207 with increased density of the plurality of second openings 209 and the plurality of first openings 207 (e.g., a tight spacing or pitch between second openings 209 and first openings 207) may reduce the formation of a visible imprint on the substrate. Further, a decreased length 350A, 350B of a number of the plurality of second openings 209 or the plurality of first openings 207 may provide modulation of secondary electrons by varying the hollow cathode effect provided by the first openings 207 and/or the second openings 209. Utilization of the openings 500, 600 and/or 700 may provide reduced plasma formation at locations proximate thereto which may increase global uniformity. For example, testing of one or more of the openings 500, 600 and 700 in the center area 214 of the dual-channel showerhead 118 reduced deposition at the center of the substrate. The reduced deposition resulted in an increase in uniformity of the film deposited thereon.

While the foregoing is directed to embodiments of the disclosure, other and further embodiments of the disclosure may be devised without departing from the basic scope thereof, and the scope thereof is determined by the claims that follow.

What is claimed is:

1. A showerhead for a semiconductor processing chamber, the showerhead comprising:
   a body comprising a conductive material having a plurality of first openings formed between a first surface and a second surface opposite to the first surface, each of the plurality of first openings comprising a first gas channel and a plurality of second openings formed in the second surface, each of the plurality of second openings comprising a second gas channel that is fluidly separated from the first gas channel, wherein each of the first openings have a geometry that is different than each of the second openings, and wherein the body includes an annular channel and the plurality of second openings are in fluid communication with the annular channel by a connecting channel; and
   a blind cone formed in the second surface.

2. The showerhead of claim 1, wherein each of the plurality of first openings and the plurality of second openings include a flared opening, and the flared openings of the first openings has a geometry that is different than a geometry of the flared openings of the second openings.

3. The showerhead of claim 2, wherein a length of the flared openings of the second openings is less than a length of the flared openings of the first openings.

4. The showerhead of claim 2, wherein the flared openings of one or both of the first openings and second openings includes a roughened surface.

5. The showerhead of claim 2, wherein the flared openings of one or both of the first openings and second openings includes a coating.

6. The showerhead of claim 5, wherein the coating comprises $Si_vY_wMg_xAl_yO_z$, and wherein:
   $v+w+x+y+z=1$ (excluding impurities)
   v is about 0.0196 to about 0.2951;
   w is about 0.0131 to about 0.1569;
   x is about 0.0164 to about 0.0784;
   y is about 0.0197 to about 0.1569; and
   z is about 0.5882 to about 0.6557.

7. The showerhead of claim 2, wherein the flared openings of one or both of the first openings and second openings includes a rounded corner.

8. The showerhead of claim 1, wherein the blind cone includes a flare angle of about 5 degrees to about 20 degrees from a longitudinal axis of the blind cone.

9. The showerhead of claim 8, wherein the blind cone is fomed in a center area of the body.

10. A showerhead for a semiconductor processing chamber, the showerhead comprising:
    a body comprising a conductive material having a plurality of first openings formed between a first surface and a second surface opposite to the first surface, each of the plurality of first openings comprising a first gas channel and a plurality of second openings formed in the second surface, each of the plurality of second openings comprising a second gas channel that is fluidly separated from the first gas channel, wherein each of the first openings have a geometry that is different than each of the second openings, and wherein each of the plurality of first openings and the plurality of second openings include a flared portion, and wherein the body includes an annular channel and the plurality of second openings are in fluid communication with the annular channel by a connecting channel; and
    a blind cone formed in the second surface.

11. The showerhead of claim 10, wherein the flared portions of the first openings have a geometry that is different than a geometry of the flared portions of the second openings.

12. The showerhead of claim 10, wherein the blind cone includes a flare angle of about 5 degrees to about 20 degrees from a longitudinal axis of the blind cone.

13. The showerhead of claim 12, wherein the blind cone is fomed in a center area of the body.

14. The showerhead of claim 10, wherein the flared openings of one or both of the first openings and second openings includes a coating.

15. A showerhead for a semiconductor processing chamber, the showerhead comprising:
    a body comprising a conductive material having a plurality of first openings formed between a first surface and a second surface opposite to the first surface, each of the plurality of first openings comprising a first gas channel and a plurality of second openings formed in the second surface, each of the plurality of second openings comprising a second gas channel that is fluidly separated from the first gas channel, each of the first openings having a geometry that is different than each of the second openings, wherein each of the plurality of first openings and the plurality of second openings include a flared portion and the flared portions of the first openings have a geometry that is different than a geometry of the flared portions of the second openings, and wherein the body includes an annular channel and the plurality of second openings are in fluid communication with the annular channel by a connecting channel; and a blind cone formed in the second surface.

16. The showerhead of claim 15, wherein the blind cone includes a flare angle of about 5 degrees to about 20 degrees from a longitudinal axis of the blind cone.

17. The showerhead of claim 16, wherein the blind cone is fomed in a center area of the body.

18. The showerhead of claim 15, wherein the flared portions of one or both of the first openings and second openings includes a rounded corner.

19. The showerhead of claim 15, wherein the flared portions of one or both of the first openings and second openings includes a coating.

20. The showerhead of claim 19, wherein the coating comprises $Si_vY_wMg_xAl_yO_z$, and wherein:

v+w+x+y+z=1 (excluding impurities)
v is about 0.0196 to about 0.2951;
w is about 0.0131 to about 0.1569;
x is about 0.0164 to about 0.0784;
y is about 0.0197 to about 0.1569; and
z is about 0.5882 to about 0.6557.

\* \* \* \* \*